US007323356B2

(12) United States Patent
Hosono et al.

(10) Patent No.: US 7,323,356 B2
(45) Date of Patent: Jan. 29, 2008

(54) LNCUO(S,SE,TE)MONOCRYSTALLINE THIN FILM, ITS MANUFACTURING METHOD, AND OPTICAL DEVICE OR ELECTRONIC DEVICE USING THE MONOCRYSTALLINE THIN FILM

(75) Inventors: Hideo Hosono, Kanagawa (JP); Masahiro Hirano, Tokyo (JP); Hiromichi Ota, Kanagawa (JP); Masahiro Orita, Chiba (JP); Hidenori Hiramatsu, Kanagawa (JP); Kazushige Ueda, Kanagawa (JP)

(73) Assignee: Japan Science and Technology Agency, Kawaguchi-shi (JP)

( * ) Notice: Subject to any disclaimer, the term of this patent is extended or adjusted under 35 U.S.C. 154(b) by 388 days.

(21) Appl. No.: 10/505,219

(22) PCT Filed: Feb. 19, 2003

(86) PCT No.: PCT/JP03/01756

§ 371 (c)(1),
(2), (4) Date: Mar. 22, 2005

(87) PCT Pub. No.: WO03/071595

PCT Pub. Date: Aug. 28, 2003

(65) Prior Publication Data

US 2005/0158993 A1    Jul. 21, 2005

(30) Foreign Application Priority Data

Feb. 21, 2002  (JP)  ............... 2002-045417
Jul. 5, 2002   (JP)  ............... 2002-197744

(51) Int. Cl.
*H01L 21/06*  (2006.01)
*C30B 1/02*   (2006.01)
*C04B 35/50*  (2006.01)

(52) U.S. Cl. ............... 438/102; 257/42; 257/43; 257/E31.027; 257/E31.029; 438/84; 438/85; 438/104; 501/152; 117/8

(58) Field of Classification Search ............ 257/42–43, 257/E31.027, E31.028, E31.029; 438/84–85, 438/102–104; 501/152; 117/8
See application file for complete search history.

(56) References Cited

U.S. PATENT DOCUMENTS

| 5,530,267 | A  | * | 6/1996 | Brandle et al. | ............... 257/76 |
| 6,275,716 | B1 | * | 8/2001 | Tauber et al. | ............... 505/190 |
| 6,878,962 | B1 | * | 4/2005 | Kawasaki et al. | ............ 257/43 |
| 2002/0096687 | A1 | * | 7/2002 | Kuo et al. | ................... 257/99 |

FOREIGN PATENT DOCUMENTS

JP    2002-80222    3/2002

OTHER PUBLICATIONS

Takano, Y., et al. "Single Crystal Growth of (LaO)CuS." J. of Alloys & CMPDS. vol. 249 (1997): pp. 221-223.*
Ishikawa, K., et al. "Preparation and Electrical Properties of (LaO)AgS and (LnO)CuS (Ln=La, Pr, or Nd)." J. Electrochem. Soc. vol. 138 (1991): pp. 1166-1170.*
Ueda, K., et al. "Transparent p-type Semiconductor: LaCuOS Layered Oxysulfide." Appl. Phys. Lett. vol. 77 (2000): pp. 2701-2703.*
Ueda, K., et al. "Room-Temperature Excitons in Wide-Gap Layered-Oxysulfide Semiconductor: LaCuOS." Appl. Phys. Lett. vol. 78 (2001): pp. 2333-2335.*
Hidenori Hiramatsu et al., "Wide-gap p-gata Handotai LaCuOS no Epitaxial Seicho to Kobutsusei", Dai 49 Kai Oyo Butsurigaku Kankei Rengo Koenkai Koen Yokoshu, Mar. 27, 2002 No. 2, p. 629. Cited in the PCT search report.
K. Ueda et al., "Room temperature exciton in wide-gaps layered-oxysulfide semiconductor: LaCuOS", Applied Physics Science, Apr. 16, 2001 vol. 78, No. 16 pp. 2333-2335. cited in the PCT search report.
K. Ueda et al., "Transparent p-type semiconductor: LaCuOS layered oxysylfide", App. Phys. Letter, Oct. 23, 2000, vol. 77, No. 17, pp. 2701 to 2703. Cited in the PCT search report.
D.O. Charkin et al., Russian Journal of Inorganic Chemistry, vol. 44, No. 6, 1999, pp. 833-837.
Kenji Ishikawa et al., J. Electrochem. Soc., vol. 138, No. 4, Apr. 1991, pp. 1166-1170.

Yoshiki Takano et al., Elsevier, Physica B 206 & 207 (1995) pp. 764-766.
Hidenori Hiramatsu et al., Journal of Applied Physics, vol. 91, No. 11, Jun. 1, 2002, pp. 9177-9181.
Kazushige Ueda et al., Elsevier, The Solid Film 411 (2002) pp. 115-118.
Kazushige Ueda et al., Journal of Applied Physics, vol. 91, No. 7, Apr. 1, 2002 pp. 4768-4770.

* cited by examiner

*Primary Examiner*—B. William Baumeister
*Assistant Examiner*—Matthew W. Such
(74) *Attorney, Agent, or Firm*—Westerman, Hattori, Daniels & Adrian, LLP.

(57) ABSTRACT

Disclosed is a method of producing an LnCuOX single-crystal thin film (wherein Ln is at least one selected from the group consisting of lanthanide elements and yttrium, and X is at least one selected from the group consisting of S, Se and Te), which comprises the steps of growing a base thin film on a single-crystal substrate, depositing an amorphous or polycrystalline LnCuOX thin film on the base thin film to form a laminated film, and then annealing the laminated film at a high temperature of 500° C. or more. While a conventional LnCuOX film produced by growing an amorphous film through a sputtering process under appropriate conditions and then annealing the film at a high temperature was unexceptionally a polycrystalline substance incapable of achieving high emission efficiency and electron mobility required for a material of light-emitting devices or electronic devices, the method of the present invention can grow a thin film with excellent crystallinity suitable as a single crystal to an building black of light-emitting diodes, semiconductor leasers, filed-effect transistors, or a hetero-bipolar transistors.

10 Claims, 7 Drawing Sheets

LNCUO(S,SE,TE)MONOCRYSTALLINE THIN FILM, ITS MANUFACTURING METHOD, AND OPTICAL DEVICE OR ELECTRONIC DEVICE USING THE MONOCRYSTALLINE THIN FILM

TECHNICAL FIELD

The present invention relates to a method of producing an LnCuO (S, Se, Te) single-crystal thin film (wherein Ln is at least one selected from the group consisting of lanthanide elements and yttrium (Y)), a single-crystal thin film obtained through the production method, and an optical or electronic device using the single-crystal thin film.

BACKGROUND ART

[Production Method for Vapor-Phase Epitaxial Film]

Vapor-phase epitaxial growth means that, when a deposited film is grown on a single-crystal substrate in a vacuum atmosphere, the growth proceeds while maintaining a given relationship between the respective crystal orientations of the substrate and the deposited film under the influence of the orderly atomic arrangement of the crystal of the substrate. A typical thin film growth technology based on the epitaxial growth includes a sputtering process, a chemical vapor deposition (CVD) process, a molecular beam epitaxy (MBE) process and a pulsed laser deposition (PLD) process.

Currently, the sputtering process using non-equilibrium evaporation is most widely used and industrially applied. A sputtering process for use as a film forming method utilizes a so-called sputtering-phenomenon discovered by W. Grove in 1852. The sputtering phenomenon means that high-kinetic energy particles emitted onto the surface of a target (ions or atoms neutralized by electrons around the target surface) give the kinetic momentum of the particles to constitutive atoms of the target through an elastic collision therebetween, and the recoil atoms are finally released from the target surface after repeatedly colliding with adjacent atoms. The film forming method based on the sputtering process is intended to deposit the released constitutive atoms of the target on a substrate so as to form a thin film.

The chemical vapor deposition (CVD) process is intended to grow a thin film having a desired composition on a substrate by using chloride or organometal compound as a source material, and inducing the chemical reaction between source gases on the substrate. The CVD process having excellent compatibility to mass production is widely used to produce practical materials for semiconductor lasers and others.

The molecular beam epitaxy (MBE) process is a thin-film crystal growth technology named in 1968 by J. R. Arthur who was with Bell Laboratory at the time, and developed for compound semiconductors, primarily GaAs. The MBE process can be considered as an improved or progressive type of a vacuum deposition process.

Specifically, the MBE process is intended to perform an epitaxial crystal growth under the conditions that the flow of neutral molecules (or atoms) serving as raw materials of a crystal to be grown, or the intensity of a molecular beam (atomic beam), is accurately controlled in ultra-high vacuum, and the neutral molecules (or atoms) are emitted onto an accurately temperature-controlled substrate. The MBE process can be applied to a wide range of materials including compound semiconductors, elementary semiconductors such as Si, and various metal or oxide superconductors. The difference from the conventional vacuum deposition process is in that (i) the vacuum degree in a growth chamber is set at $10^{-7} \sim 10^{-8}$ Pa or less, (ii) the crystal growth is performed while stably maintaining the cleanness of the crystal surface at the atomic scale, and (iii) the intensity of the molecular beam is accurately controlled.

The research and development of the pulsed laser deposition (PLD) process was started soon after the first success in ruby laser oscillation in 1960. From the last half of the 1980s, the pulsed laser deposition (PLD) process using an excimer laser has been actually applied to a production method for a single-crystal thin film of high-temperature superconducting material, dielectric material or organic polymer Laser ablation means a process of etching the surface of a solid utilizing a phenomenon that when the intensity of laser light emitted onto a solid is increased up to a given threshold value or more, the laser light is converted into electronic, thermal, photochemical and mechanical energies on the solid surface, and consequently various kinds of fragments (neutral atoms, molecules, positive/negative ions, radicals, clusters, etc.) are explosively released from the solid surface.

The PLD process utilizes the principle of the laser ablation to produce a single-crystal thin film on a substrate under an ultra-high vacuum atmosphere set at a vacuum degree of $10^{-7} \sim 10^{-8}$ Pa or less in a growth chamber, or under a sufficiently controlled atmosphere based on the flow of reactive gas. While the PLD process is a non-equilibrium process as with the sputtering process, it is different from the sputtering process in that the difference between the respective compositions of a target and an obtained film is small, and single-crystal films of various material can be produced by simply replacing a target. In recent years, the PLD process is actively used, particularly, in the field of research on exploration of substances, by utilizing the above features.

DISCLOSURE OF INVENTION

The present invention is directed to the development of a technique for achieving LnCuOX epitaxial single-crystal thin film growth (wherein Ln is at least one selected from the group consisting of lanthanide elements and yttrium (Y), and X is at least one selected from the group consisting of S, Se and Te) by use of a solid-phase epitaxial process. It has been verified that LnCuOX exhibits luminescence or light-emission originated from excitons even in a polycrystalline film thereof. Therefore, LnCuOX has much promise as materials for light-emitting devices. For example, if an LnCuOX single-crystal thin film is obtained, it can be used as a material of ultraviolet light-emitting devices. However, in case of using a film forming method performed in a vacuum atmosphere at high temperatures, it is difficult to obtain even a single-phase LnCuOX thin film, because the Cu compound and X component contained in LnCuOX as the constitutive elements thereof have a high vapor pressure.

LnCuOX is a wide-bandgap p-type semiconductor. Generally, most of wide-bandgap substances, such as ZnO and $SnO_2$, can not exhibit both n- and p-types conductively but an n-type semiconductor having electrons as a main carrier. Thus, if a Field Effect Transistor (FET) structure is formed using such substances, a gate operating voltage will be positive. Whereas, if the same FET structure is constructed using LnCuOX which is a wide-bandgap p-type semiconductor, a gate operating voltage will be negative. Therefore, a wide-bandgap Complementary Metal-Oxide Semiconductor (CMOS) circuit, or a high-performance transparent electronic circuit, can be produced by combining this p-type wide-bandgap semiconductor FET with the aforementioned n-type wide-bandgap semiconductor FET. Otherwise, the p-type wide-bandgap semiconductor can also be combined with an n-type semiconductor to produce a hetero-junction bipolar transistor or light-emitting diode using a p-n junction.

[LnCuOX]

In 1981, the existence of layer-structured oxysulfide LaCuOS was first reported by Palazzi (M. Palazzi, Acad. Sci. Paris C. R. 292, 789 (1981)). The crystal system of LaCuOS is a tetragonal system with the space group No. 129, P4/nmm, wherein the Z value=2, and the lattice parameters: a=3.999 Å, c=8.53 Å. LaCuOS has a layer structure in which a $(La_2O_2)^{2+}$ layer and a $(Cu_2S_2)^{2-}$ layer are alternately stacked along the c-axis of the tetra system.

In 2000, K. Ueda et al. first reported that LaCuOS is a transparent p-type semiconductor having a bandgap of about 3.1 eV which suggests promise as a next-generation wide-bandgap p-type semiconductor material (K. Ueda, S. Inoue, S. Hirose, H. Kawazoe and H. Hosono, Appl. Phys. Lett., 77, 2701 (2000)).

In 2001, K. Ueda et al. reported that LaCuOS exhibits exciton-originated optical absorption/emission characteristics having stability even at room temperature, and has promise as a next-generation material of ultraviolet light-emitting devices (K. Ueda, S. Inoue, H. Hosono, N. Sarukura and M. Hirano, Appl. Phys. Lett., 78, 2333 (2001)).

As is generally known, even if the La site of LaCuOS is substituted with another lanthanide element or the S site of LaCuOS is substituted with another chalcogen element, i.e. Se or Te, the same crystal structure will be maintained. It has also been reported that these are synthesized in a similar way (D. O. Charkin, A. V. Akopyan and V. A. Dolgikh, Russian J. Inorg. Chem., 44, 833 (1999)). Therefore, with respect to all kinds of LnCuOX, a single-crystal thin film can be grown in basically the same techniques.

[LnCuOX with Ln Site Substituted with $M^{2+}$]

It is known that the electrical conductivity of LnCuOX is increased up to about $10^2$ S/cm by substituting the Ln site with divalent alkali earth metal ions of Sr and Ca (K. Ishikawa, S. Kinoshita, Y. Suzuki, S. Matsuura, T. Takanishi, M. Aizawa and Y. Suzuki, J. Electrochem. Soc. 138, 1166 (1991), and Y. Takano, K. Yahagi and K. Sekizawa, Physica A 206&207, 764 (1995)). It has also been reported that even an LnCuOX polycrystal thin film with the Ln site substituted with Sr has an electrical conductivity increased from $6.4\times 10^{-5}$ S/cm up to 20 S/cm, and a maximum hole concentration increased up to $2.7\times 10^{20}$ cm$^{-3}$ (Reference: H. Hiramatsu, M. Orita, M. Hirano, K. Ueda and H. Hosono, J. Appl. Phys. 91, 9177 (2002)).

[Solid Solution of LaCuOS and LaCuOSe]

LaCuOS and LaCuOSe prepared by substituting the S site of LaCuOS with Se exhibit complete solid solubility therebetween, and form a solid solution $LaCuOS_{1-x}Se_x$ (0<x<1) (K. Ueda and H. Hosono, Thin Solid Films, 411, 115 (2002)). It is known that the bandgap of the $LaCuOS_{1-x}Se_x$ can be controllably changed from 3.1 eV to 2.8 eV by continuously varying the value x representing the amount of substitution from zero to 1 (K. Ueda and H. Hosono, J. Appl. Phys. 91, 4768 (2002)). Thus, a $LaCuOS_{1-x}Se_x$ film prepared by accurately controlling the value x and the thickness thereof can have a desirably controlled light-emission wavelength. It is also possible to form quantum well structure using the mixed compounds.

[Conventional LnCuOX-Film Production Method & Problems Therein]

While LnCuOX is a wide-bandgap p-type semiconductor and it is expected to be applicable to the active layer of an ultraviolet light-emitting device, it was very difficult to produce a single-crystal thin film thereof. Heretofore, a LnCuOX thin film has been produced by annealing an amorphous film at a high temperature which were deposits by a sputtering process under appropriate conditions, (K. Ueda, S. Inoue, S. Hirose, H. Kawazoe and H. Hosono, Appl. Phys. Lett. 77, 2701 (2000)).

However, a film produced by the above method was unexceptionally a polycrystalline from incapable of achieving high light-emission efficiency and large electron mobility required for a material of light-emitting devices or electronic devices. Thus, it has been strongly desired to develop a single-crystal thin film production method capable of effectively growing a thin film excellent in crystallinity so as to allow LnCuOX to be practically used as a light-emitting material or a p-type conductive semiconductor. In order to solve the above mentioned problems, the present invention provides a method of producing an LnCuOX single-crystal thin film (wherein Ln is at least one selected from the group consisting of lanthanide elements and yttrium, and X is at least one selected from the group consisting of S, Se and Te). The method comprises the steps of growing a base thin film on a single-crystal substrate, depositing an amorphous or polycrystalline LnCuOX thin film on the base thin film to form a stacked film, setting the bi-layered film in a vacuum, and then annealing the stacked film at a high temperature of 500° C. or more in the vacuum to grow an LnCuOX single-crystal thin film.

Initially very thin film of the LnCuOX single-crystal is formed on a film which serves as the base film. In this reaction process, if either one of Cu, $Cu_2S$, CuS, $Cu_2O$, CuO, CuCl, $CuCl_2$ and CuI films is used as the base thin film, the component Cu, O or S of the base thin film will be mixed in LnCuOX, and Ce or I is vanished by the vaporization, and thereby LnCuOX will be epitaxially grown directly on the single-crystal substrate made of either one of YSZ (Yttria-Stabilized Zirconia), $Y_2O_3$, STO (strontium titanate), $Al_2O_3$ and MgO, on which the base thin film is grown.

Otherwise, if either one of an Ag film, an Ag compound film such as an $Ag_2S$, $Ag_2O$, AgO, AgCl or AgI film, and an Au film is used as the base thin film, instead of the Cu, $Cu_2S$, CuS, $Cu_2O$, CuO, CuCl, $CuCl_2$ or CuI film, the components of the base thin film will be entirely left on the single-crystal substrate made of either one of YSZ, $Y_2O_3$, STO, $Al_2O_3$ and MgO, or will be partially diffused in LnCuOX and left therein as impurities.

In the method of the present invention, the stacked film composed of the amorphous or polycrystalline LnCuOX thin film and the base thin film on the single-crystal substrate is annealed while enclosing the film in a vacuum environment, vacuum sealed capsule for example, so as to prevent the components Cu and X from being vaporized during a heating treatment.

The LnCuOX single-crystal thin film produced in this manner can be used as the active layer of an ultraviolet light-emitting device (diode or laser) by taking advantage of its high light-emission efficiency at room temperature associated with exciton. The LnCuOX single-crystal thin film can be used as a channel layer of a field-effect transistor (FET) to produce a transparent FET to be operated at a negative gate voltage. The FET device combined with n-channel FET to produce a CMOS circuit or a hetero-bipolar device.

BEST MODE FOR CARRYING OUT THE INVENTION

Figure 1:
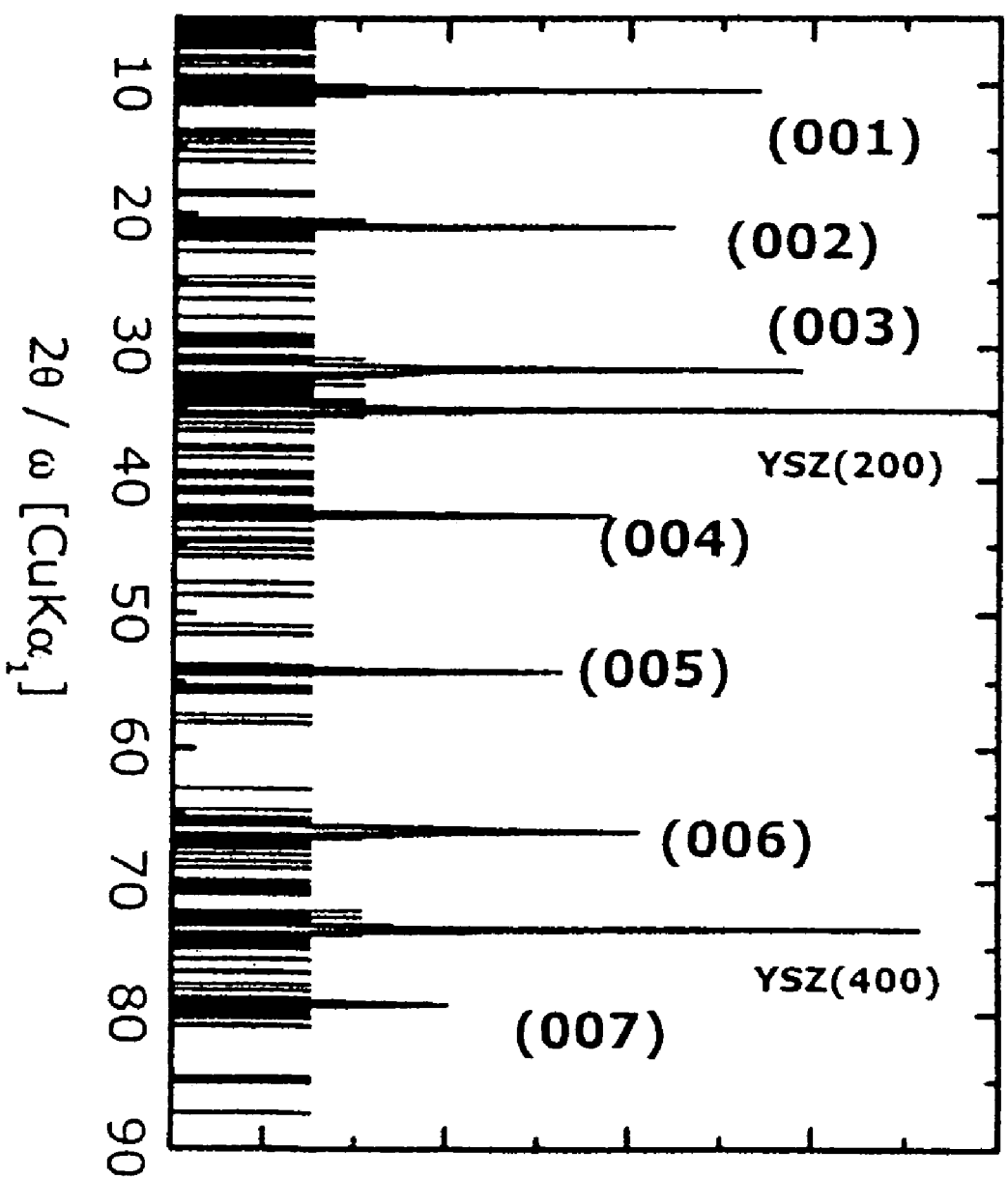
FIG. 1 is a graph showing an out-of-plane XRD pattern representing the crystallinity of an LnCuOX single-crystal thin film produced in Inventive Example 1.

In a method of producing an LnCuOX single-crystal thin film, according to the present invention, a base thin film may be grown appropriately using a conventional film forming method, such as a sputtering process, a CVD process, a MBE process or a PLD process. A single-crystal substrate for use in the method may be made of either one of YSZ, $Y_2O_3$, STO, $Al_2O_3$ and MgO. In particular, a YAS (100), $Y_2O_3$ (100) or MgO (100) single crystal is preferably used as the single-crystal substrate, because they have no risk of causing a chemical reaction with an LnCuOX compound even at a high temperature of 1200° C. or less.

More specifically, it is desirable to use a single-crystal substrate in which the anion-anion nearest-neighbour distance in the substrate crystal plane (A-substrate) is close to the anion-anion nearest-neighbour distance in the C plane of LnCuOX (A-film), or which has less lattice mismatch. For example, the A-substrate is 2.82 for LaCuOS, 2.88 for LaCuOSe, 2.96 for MgO (100), 2.58 for YSZ (100), and 2.92 for $Y_2O_3$ (100). Thus, in case of growing a LaCuOS.Se single-crystal thin film, $Y_2O_3$, MgO and YSZ have a higher priority for the single-crystal substrate in this order, in view of the lattice mismatch.

In the initial process of the film growth , a base thin film made of either one material selected from the group consisting of Cu, $Cu_2S$, CuS, $Cu_2O$, CuO, CuCl, $CuCl_2$, CuI, Ag, $Ag_2S$, $Ag_2O$, AgO, AgCl, AgI and Au, is grown on the single-crystal substrate, such as an YSZ, $Y_2O_3$ or MgO single-crystal substrate. If the base thin film is made of Cu or Cu-based compound, the components Cu, O and/or S of the base thin film will be mixed in an LnCuOX thin film to be deposited onto the base thin film. Whereas, if the base thin film is made of a material other than Cu or Cu-based compound, the components of the base thin film will be left on the interface between the single-crystal substrate and the LnCuOX thin film, or partially diffused into the LnCuOX thin film.

Then, an LnCuOX thin film is deposited on the base thin film by using an LnCuOX sintered body as a target, under an $H_2S$ atmosphere when LnCuOX is LnCuOS, or under an argon or vacuum atmosphere when LnCuOX is LnCuOSe or LnCuOTe. While a sputtering process or a PLD process is preferably used for depositing the LnCuOX thin film in view of their simplicity, the present invention is not limited to such process. The LnCuOX thin film to be deposited on the base thin film may be polycrystalline or may be amorphous.

Alternatively, a solid-solution film may be deposited on the base thin film by using an $LnCuOX_{1-x}X'_x$ (each of X and X' is at least one selected from the group consisting of S, Se and Te, wherein X and X' are different elements; 0<x<1) solid-solution sintered body as a target. In this case, a single-crystal film having the above solid-solution composition is obtained as a final product. Otherwise, a stacked of film different in composition may be deposited in the form of multilayer by using two kinds of targets different in Ln or X. In this case, a solid-solution single-crystal thin film having a composition which is a film-thickness-weighted average of all of the film compositions is obtained as a final product.

The solid solution $LnCuOX_{1-x}X'_x$ is useful as a light-emitting material because the light-emission wavelength thereof can be continuously changed by controlling the value of x. In addition, the forbidden band or energy gap of the solid solution $LnCuOX_{1-x}X'_x$ is continuously changed depending on the value of x. Thus, artificial superlattice structures is formed by alternately laminating single-crystal films different in the value of x.

Laminated film composed of the LnCuOX thin film and the base thin film on the single-crystal substrate is enclosed in a vacuum environment, such as in sealed vacuum capsule, and subjected to a heat treatment at a temperature of 500° C. or more, preferably 1000° C. or more. Under the condition of less than 500° C., any homogeneous single-crystal LnCuOX thin film cannot be obtained due to insufficient diffusion. On the other hand, when a heating temperature is 1200° C. or more the undesirable reaction between the single-crystal substrate and the LnCuOX compound takes place. Further, the softening of quartz glass make it usable as a material to form sealed vacuum capsule.

The components Cu and X have a high vapor pressure. Thus, if the laminated film is annealed at a high temperature under a vacuum atmosphere, a high-quality LnCuOX single crystal cannot be obtained in some cases, due to significant change in the composition of the thin film obtained after the heat treatment, due to vaporization of the components Cu and X from the LnCuOX thin film. In order to suppress the vaporization of the components Cu and X, in advance of the heating treatment, the laminated film is enclosed in such a vacuum environment as typically enclosed in a quartz tube which is vacuumized and then hermetically sealed.

Furthermore, in order to suppress very slight evaporation of Cu and X, annealing may be carried out in an atmosphere containing LnCuOX vapor, generating in the vacuum sealed chamber LnCuOX vapor having the same chemical formula as that of the single-crystal thin film, compensating the vapor pressure of Cu and X in the vacuum sealed and heated atmosphere. For example, this may be achieved in such a way that LnCuOX powder is enclosed in the closed vacuum environment together with the laminated film.

In case of using the LnCuOX powder, the LnCuOX vapor generated during the heating treatment is solidified in the form of particles, and the particles are likely to be deposited on surface of the single-crystal thin film so as to cause the roughened surface thereof. In order to prevent this problem, before the laminated film is enclosed in the vacuum environment, the surface of the LnCuOX thin film may be covered by plate, such as YSZ plate, which has no reactivity with the LnCuOX thin film.

The vaporization of the components Cu and X may also be suppressed by preparing an additional laminated film composed of the LnCuOX thin film and the base thin film on the single-crystal substrate, attaching the respective surfaces of the aforementioned laminated film and the additional laminated film together, and then enclosing these laminated films in the vacuum environment. The above additional film may be composed of the LnCuOX thin film on the single-crystal substrate without the base thin film. In this case, only the laminated film having the base thin film will be formed as the LnCuOX single-crystal thin film.

As with polycrystals, the Ln site of LnCuOX can be substituted with a divalent ion of a metal M (M is at least one selected from the group consisting of Mg, Ca, Sr, Ba and Zn) to effectively create hole carriers. In this case, the divalent metal ion may be contained in a sintered body target to substitute the Ln site of the LnCuOX thin film with the divalent metal ion. The amount of the substitution may be varied to continuously change the electrical conductivity of an $Ln_{1-y}M_yCuOX$ single-crystal thin film (wherein $0<y<1$) from $10^{-5}$ S/cm to 80 S/cm.

A combination of the single-crystal substrate and the LnCuOX thin film having a large lattice mismatch therebetween is likely to cause difficulties in growing a single-crystal film. For example, when a $LaCuOS_{1-x}Se_x$ film having x of 0.5 or more is grown on a (100) plane of an YSZ substrate, it is difficult to obtain a single-crystal film. Even in such a case, a single-crystal $LaCuOS_{1-x}Se_x$ solid-solution thin film can be obtained by growing an LnCuOX single-crystal thin film having less lattice mismatch on a (100) plane of an YSZ substrate through the aforementioned process, depositing an LnCuOSe thin film on the LnCuOX single-crystal thin film to form a laminated film, and annealing the laminated film at a high temperature of 500° C. while enclosing the laminated film in a vacuum environment. That is, an amorphous or polycrystalline LnCuOX' is solid-phase diffused into the LnCuOX single-crystal thin film to grow an $LnCuOX_{1-x}X'_x$ single-crystal thin film having large lattice mismatch with the single-crystal substrate. In this case, the Ln site of the LnCuOX single-crystal thin film may be substituted with a divalent ion of the metal M.

The solid solution $LnCuOX_{1-x}X'_x$ is useful as a material for light emitting devices because the light-emission wavelength thereof can be continuously changed by controlling the value of x. In addition, the forbidden band or energy gap of the solid solution $LnCuOX_{1-x}X'x$ is continuously changed depending on the value of x. Thus, alternate lamination of single-crystal films different in the value of x may result in the formation of an artificial superlattice structure.

The LnCuOX single-crystal thin film or the $Ln_{1-y}M_yCuOX$ single-crystal thin film obtained in this manner can be laminated to an n-type semiconductor consisting of either one of ZnO, ZnS, $In_2O_3$ and $SnO_2$ to form a PN heterojunction structure so as to produce a light-emitting diode.

The LnCuOX single-crystal thin film or the $Ln_{1-y}M_yCuOX$ single-crystal thin film can also be combined with ZnO or ZnO:Mg to form a double hetero structure so as to produce a semiconductor laser.

Further, the LnCuOX single-crystal thin film or the $Ln_{1-y}M_yCuOX$ single-crystal thin film can be used to fabricate a FET by depositing YSZ thereon as a gate insulation film, and depositing Pt—Pd or ITO (Indium-Tin Oxide) thereon as source and drain electrodes.

Furthermore, the LnCuOX single-crystal thin film or the $Ln_{1-y}M_yCuOX$ single-crystal thin film can be used to fabricate a hetero-bipolar transistor by combining with an n-type semiconductor consisting of either one of ZnO, ZnS, $In_2O_3$ and $SnO_2$ to form a hetero structure, and forming an ohmic electrode on each of the surfaces of the hetero structure.

EXAMPLE

The present invention will be described in more detail in connection with the following examples.

Inventive Example 1

1. Growth of Cu Thin Film

Cu thin film was grown on an YSZ (100) single-crystal substrate (10 mm square×0.5 mm thickness) through a PLD process at a substrate temperature of 200° C. The thickness of the Cu thin film determined by X-ray reflectance and X-ray fluorescence measurements was 5 nm. The crystallinity of the grown Cu thin film was evaluated using a HRXRD (High-Resolution X-Ray Diffraction) system. As a result, Cu was oriented toward the (111) plane of the YSZ (100) single-crystal substrate, and the tilt angle was 0.01-degree.

2. Preparation of LaCuOS/Cu Laminated Film

LaCuOS was deposited on the Cu thin film grown on the YSZ (100) single-crystal substrate as a base layer while maintaining the substrate at room temperature, through a pulsed laser deposition process (PLD process) under an $H_2S$ atmosphere using a LaCuOS sintered body as a target. Through an X-ray reflectance measurement, it was proved that the thickness of an obtained LaCuOS thin film is 200 nm. The deposited LaCuOS thin film was amorphous.

3. Preparation of LaCuOS Single-Crystal Thin Film

Two of the LaCuOS/Cu/YSZ laminated films were prepared, and the respective surfaces of the laminated films were attached together. In order to suppress the vaporization of the components Cu and S of the LaCuOS thin film having a high vapor pressure, the laminated films were enclosed in a vacuumized and sealed quartz glass tube together with LaCuOS powder (mean particle size of about 0.1 mm; about 0.1 g). Then, the sealed quartz tube capsule was annealed by heating in an ambient atmosphere at 1000° C. for 30 minutes. After the heat treatment, the laminated films were cooled to room temperature in a furnace.

4. Crystallinity of LaCuOS Single-Crystal Thin Film

The crystallinity of the obtained LaCuOS single-crystal thin film was checked using a HRXRD system (ATX-G available from Rigaku; radiation source: Cu-K$\alpha_1$). An out-of-plane pattern is shown in FIG. 1. A strong diffraction peak from the (001) plane of LaCuOS was observed together with an YSZ (100) peak. The out-of-plane pattern shows that LaCuOS (001) is strongly oriented on YSZ (100). According to a rocking curve measurement, the tilt angle of the LaCuOS (001) plane was 0.1-degree. Any diffraction due to the Cu thin film used as the base thin film disappeared. Based on the in-plane measurement, it was verified that the prepared LaCuOS thin film is epitaxially grown. The epitaxial relationship is channeled as follows.

LaCuOS (001)//YSZ (100)

LaCuOS (110)//YSZ (010)

Figure 2:
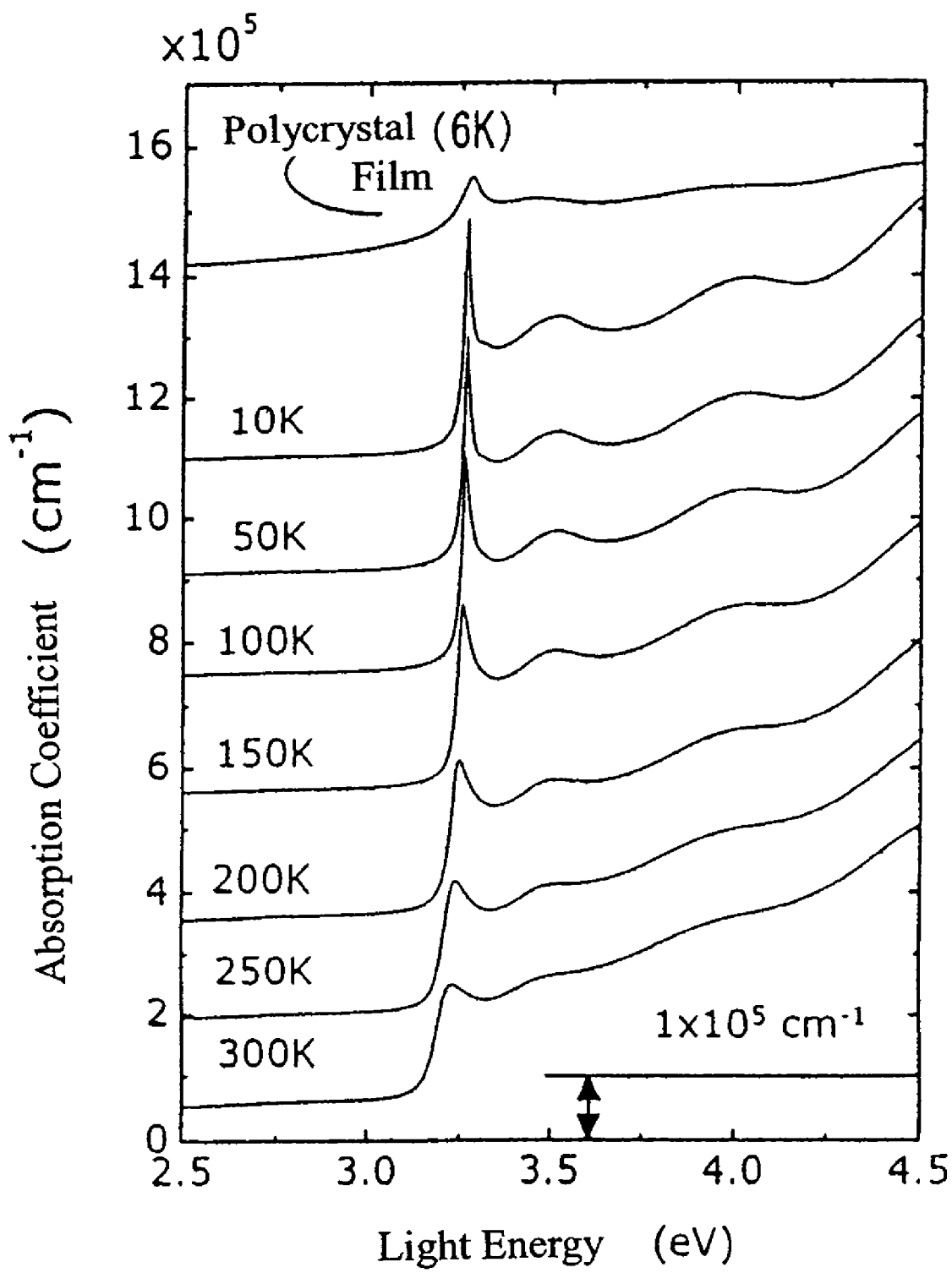
FIG. 2 is a graph showing an optical-absorption spectrum in the temperature range of 10 to 300 K of the LnCuOX single-crystal thin film produced in Inventive Example 1.

5. Optical-Absorption and Emission Characteristics of LaCuOS Single-Crystal Thin Film. The obtained LaCuOS single-crystal thin film was attached to a cryostat (4.2 K; available from Daikin). The interior space of the system was evacuated, and then cooled to 10 K. FIG. 2 shows temperature dependence of optical absorption spectra in the temperature range of 10 K to 300 K. A sharp absorption originated from exciton could be observed. As a comparative example, an optical absorption spectrum at 6 K of a LaCuOS polycrystal film is also shown in FIG. 2.

Figure 3:
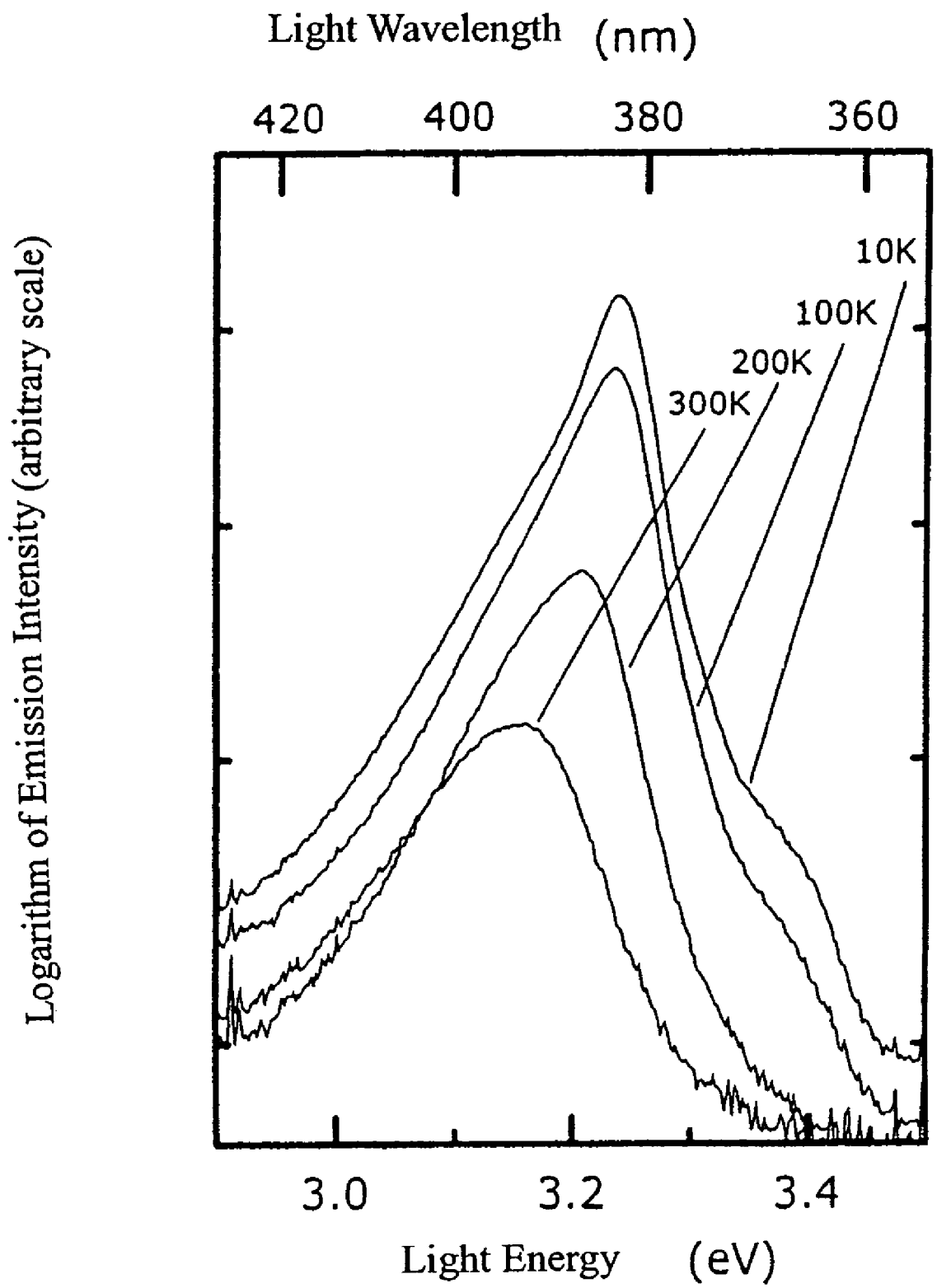
FIG. 3 is a graph showing a photo-emission spectrum in the temperature range of 10 to 300 K of the LnCuOX single-crystal thin film produced in Inventive Example 1.

An emission light was converged by a lens, and led to an optical fiber bundle. Then, the emission was spectrally divided to measure emission spectrum using a mono equip a charge-coupled device (CCD). The excitation was performed by irradiating the third harmonics (wavelength: 266 nm) of neodymium doped yttrium aluminum garnet (Nd:YAG) laser onto the thin film. FIG. 3 shows the emission spectra in the temperature range of 10 K to 300 K. A sharp ultraviolet emission having a center wavelength of 390 nm could be observed.

Inventive Example 2

1. Preparation of $Y_2O_3$ Single-Crystal Substrate

An $Y_2O_3$ single-crystal thin film was grown on an YSZ (100) single-crystal substrate (10 mm square×0.5 mm thickness) through a PLD process at a substrate temperature of 900° C. The thickness of the $Y_2O_3$ thin film determined by on an X-ray reflectance measurement was 35 nm. The crystallinity of the grown $Y_2O_3$ single-crystal thin film was evaluated using a HRXRD system. As a result, $Y_2O_3$ was oriented toward the (100) plane on the YSZ (100) single-crystal substrate, and the tilt angle was 0.5-degree. Through an in-plane measurement, it was verified that the prepared $Y_2O_3$ thin film is epitaxially grown. The epitaxial relationship is clarified as follows.

$Y_2O_3$ (100)//YSZ (100)

$Y_2O_3$ (010)//YSZ (010)

2. Preparation of Cu/$Y_2O_3$/YSZ Laminated Film

In the same preparation process as in Inventive Example 1-1, Cu thin film was grown on the $Y_2O_3$/YSZ single-crystal substrate. The crystallinity of the grown Cu thin film was evaluated using a HRXRD system. As a result, Cu was oriented toward the (111) plane on the $Y_2O_3$ (100)/YSZ (100) substrate, and the tilt angle was 0.01-degree.

3. Preparation of LaCuOS/Cu/$Y_2O_3$ Laminated Film

LaCuOS was deposited on the Cu thin film grown on the $Y_2O_3$/YSZ single-crystal substrate as a base layer while maintaining the substrate at room temperature, through a pulsed laser deposition process (PLD process) under the same conditions as those in Inventive Example 1-2. Through an X-ray reflectance measurement, it was proved that the thickness of an obtained LaCuOS thin film is 200 nm. The prepared LaCuOS thin film was amorphous.

4. Preparation of LaCuOS Single-Crystal Thin Film

In the same manner as in Inventive Example 1-3, a single-crystal LaCuOS thin film was prepared.

5. Crystallinity of LaCuOS Single-Crystal Thin Film

Figure 4:
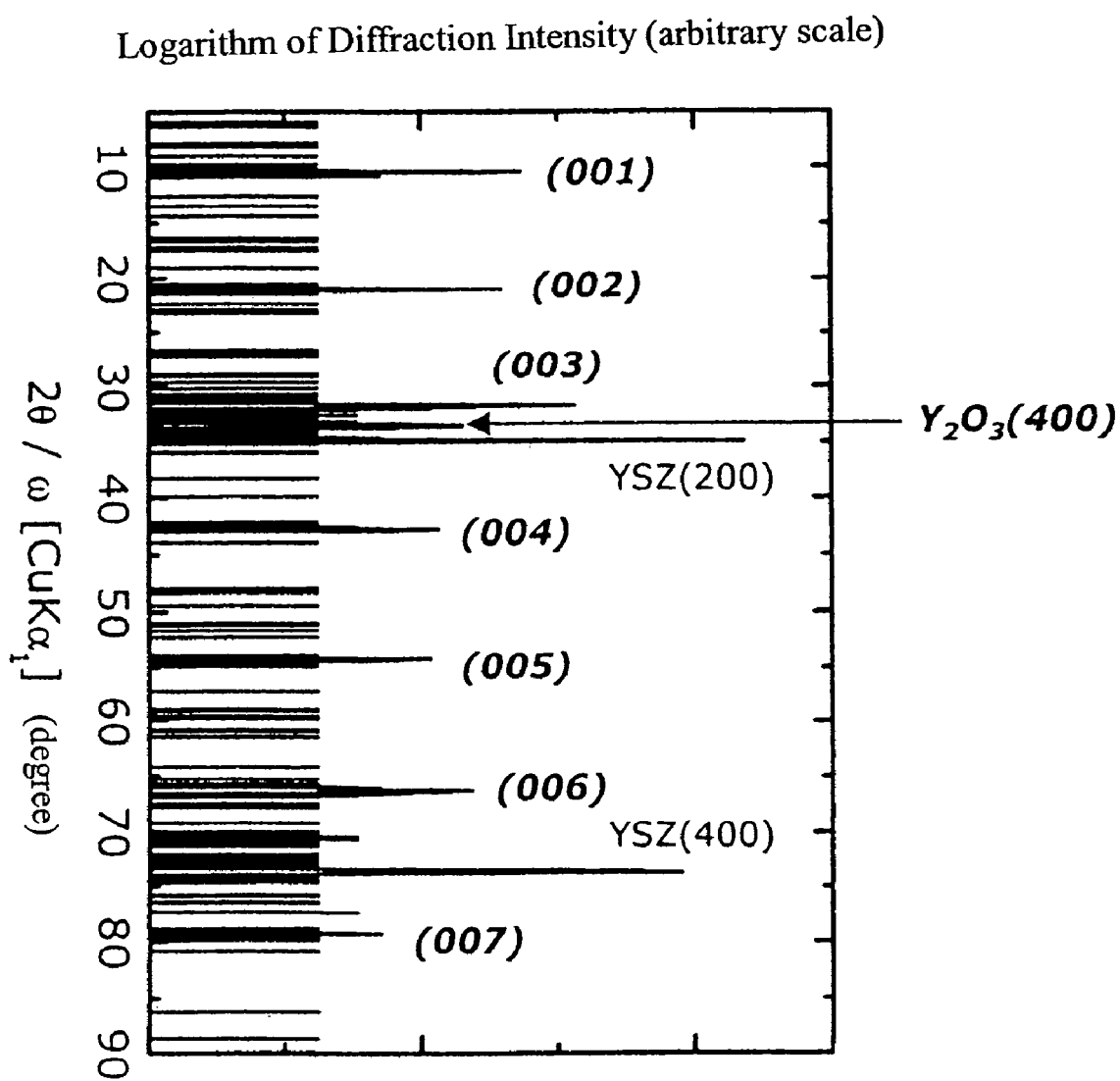
FIG. 4 is a graph showing an out-of-plane XRD pattern representing the crystallinity of an LnCuOX single-crystal thin film produced in Inventive Example 2.

The crystallinity of the prepared single-crystal thin film was checked using a HRXRD system (ATX-G available from Rigaku; radiation source: Cu-K$\alpha_1$). An out-of-plane pattern is shown in FIG. 4. $Y_2O_3$ and Cu or LaCuOS were not reacted. Further, any diffraction of the Cu thin film used as the base thin film disappeared. A strong diffraction peak from the (001) plane of LaCuOS was observed together with $Y_2O_3$ (100) and YSZ (100) peaks. The out-of-plane pattern shows that LaCuOS (001) is strongly oriented on $Y_2O_3$ (100). According to a rocking curve measurement, the tilt angle of the LaCuOS (001) plane was 0.1-degree.

Inventive Example 3

Example of Growing Single-Crystal LaCuOS$_{1-x}$Se$_x$ (0<x<1) Solid-Solution Thin Film on Substrate Having Small Lattice Mismatch 1. Growth of Cu Thin Film In the same preparation process as in Inventive Example 1-1, Cu thin film was grown on an MgO (100) single-crystal substrate. The crystallinity of the prepared Cu thin film was evaluated using a HRXRD system. As a result, Cu was oriented toward the (001) plane on the MgO (100) substrate, and the tilt angle was 0.01-degree.

2. Preparation of LaCuOS/Cu/MgO Laminated Film

LaCuOS was deposited on the Cu thin film grown on the MgO (100) single-crystal substrate as a base layer while maintaining the substrate at room temperature, through a pulsed laser deposition process (PLD process) under the same conditions as in Inventive Example 1-2. The deposited LaCuOS thin film was amorphous.

3. Preparation of LaCuOSe/LaCuOS/Cu/MgO Laminated Film

LaCuOSe was deposited on the LaCuOS/Cu/MgO laminated film while maintaining the substrate at room temperature, through a pulsed laser deposition process (PLD process) using a LaCuOSe sintered body as a target under a high vacuum atmosphere (~10$^{-5}$ Pa). The LaCuOSe thin film deposited on the LaCuOS thin film was amorphous.

The above processes from 3-1 to 3-3 were repeated to prepare three kinds of LaCuOSe/LaCuOS/Cu/MgO laminated films different in the combination of the thicknesses of the LaCuOSe and LaCuOS thin films. Further, in the same manner as in Inventive Example 1, a laminated film without the LaCuOS thin film and a laminated film without the LaCuOSe thin film were prepared. The respective film thicknesses are shown as follows.

(Amorphous LaCuOS film thickness):(Amorphous LaCuOSe film thickness)=(200:0), (150:50), (120:80), (60:140), (0:200)

4. Preparation of LaCuOS$_{1-x}$Se$_x$ (x=0, 0.25, 0.4, 0.7, 1.0) Single-Crystal Thin Film An YSZ (100) substrate material was attached onto each of the surfaces of the three kinds of LaCuOSe/LaCuOS/Cu/MgO laminated films, the LaCuOS/Cu/MgO laminated film and the LaCuOSe/Cu/MgO laminated film. In order to suppress the vaporization of the components Cu, S and Se having a high vapor pressure, each of the laminated film was enclosed in a vacuumized and sealed quartz glass tube together with LaCuOS powder and LaCuOSe powder (each mean particle size of about 0.1 mm; each weight of about 0.1 g). Then, the quartz tube was heated in an ambient pressure at 1000° C. for 6 hours. After the heat treatment, the laminated film was cooled to room temperature in a furnace.

Figure 5:
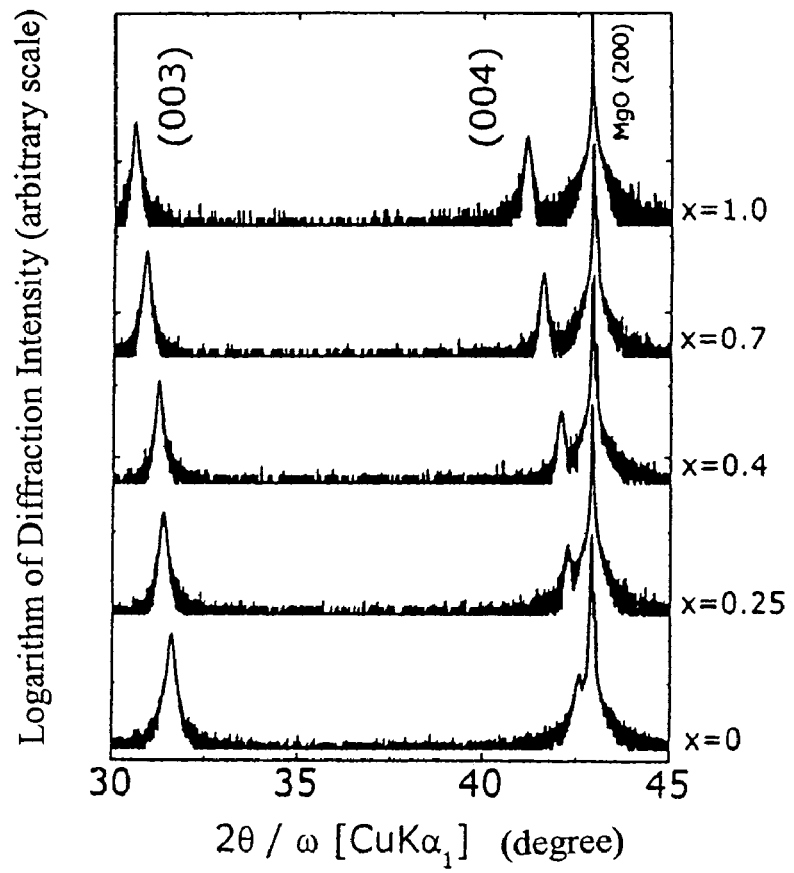
FIG. 5 is a graph showing an out-of-plane XRD pattern of a $LaCuOS_{1-x}Se_x$ (x=0, 0.25, 0.4, 0.7, 1.0) produced in Inventive Example 3.

5. Crystallinity of LaCuOS$_{1-x}$Se$_x$ (x=0, 0.25, 0.4, 0.7, 1.0) Single-Crystal Thin Film The crystallinity of each of the grown single-crystal thin films was checked using a HRXRD system (ATX-G available from Rigaku; radiation source: Cu-K$\alpha_1$). An out-of-plane pattern is shown in FIG. 5. Strong diffraction peaks for the (003) and (004) planes of LaCuOS$_{1-x}$Se$_x$ (x=0, 0.25, 0.4, 0.7, 1.0) were observed together with an MgO (200) peak. The out-of-plane pattern shows that all of LaCuOS$_{1-x}$Se$_x$ ($x=0$, 0.25, 0.4, 0.7, 1.0) are strongly oriented on YSZ (100). Further, it is proved that the length of the c-axis of the crystal is expanded (corresponding to shift of diffraction peak toward a lower angle side) as Se is dissolved into the S site to form a solid solution. Based on the in-plane measurement, it was verified that all of the growth LaCuOS$_{1-x}$Se$_x$ ($x=0$, 0.25, 0.4, 0.7, 1.0) thin films are epitaxially grown. The epitaxial relationship is shown as follows.

LaCuOS$_{1-x}$Se$_x$ ($x=0$, 0.25, 0.4, 0.7, 1.0) (001)//MgO (100)

LaCuOS$_{1-x}$Se$_x$ ($x=0$, 0.25, 0.4, 0.7, 1.0) (110)//MgO (110)

Figure 6:
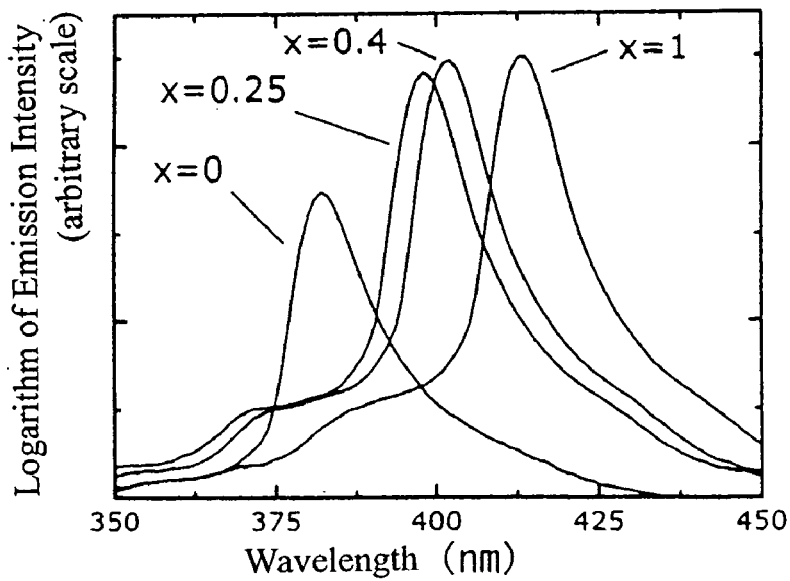
FIG. 6 is a graph showing a photo-emission spectrum at 10 K of a $LaCuOS_{1-x}Se_x$ (x=0, 0.25, 0.4, 1.0) produced in Inventive Example 3.

6. Emission Characteristic of LaCuOS$_{1-x}$Se$_x$ ($x=0$, 0.25, 0.4, 0.7, 1.0) Single-Crystal Thin Film The emission characteristic was evaluated in the same manner as in Inventive Example 1-5. FIG. 6 shows emission spectra at room temperature. A sharp emission line originated from exciton was observed. The emission wavelength was shifted toward a longer wavelength side as the concentration of Se is increased. The concentration of substituted Se can be accurately controlled to continuously change the emission wavelength from 390 nm ($x=0$) to 430 nm ($x=1$) at room temperature.

As above, when the MgO (100) substrate having small lattice mismatch is used, a single crystal LaCuOS$_{1-x}$Se$_x$ ($0<x<1$) solid-solution thin film could be epitaxially grown on the substrate according to the method as shown in this example.

Inventive Example 4

Example of Growing Single-Crystal LnCuOX$_{1-x}$X'$_x$ ($0<x<1$) Solid-Solution Thin Film on Substrate Having Large Lattice Mismatch 1. Growth of LaCuOS Single Crystal Thin Film In the same manner as in Inventive Example 1-1 to 1-4, a single-crystal LaCuOS thin film was grown on an YSZ (100) single-crystal substrate. According to an X-ray reflectance measurement, the thickness of the LaCuOS thin film was 140 nm.

2. Preparation of LaCuOSe/LaCuOS Laminated Film

LaCuOSe was deposited on the single-crystal LaCuOS thin base film while maintaining the substrate at room temperature, through a PLD process using a LaCuOSe sintered body as a target under a high vacuum atmosphere ($\sim 10^{-5}$ Pa). According to an X-ray reflectance measurement, the thickness of the LaCuOSe thin film was 60 nm. The deposited LaCuOSe thin film was amorphous.

3. Preparation of LaCuOS$_{1-x}$Se$_x$ ($x=0.7$) Single-Crystal Thin Film

Two LaCuOSe/LaCuOS/YSZ laminated films were prepared, and the respective surfaces thereof were attached together. In order to suppress the vaporization of the components Cu, S and Se having a high vapor pressure, the laminated films were enclosed in a vacuumized and sealed quartz glass tube together with LaCuOS powder and LaCuOSe powder (each mean particle size of about 0.1 mm; and weight of about 0.1 g). Then, the sealed quartz tube was heated in a ambient atmosphere at 1000° C. for 6 hours. After the heat treatment, the laminated films were cooled to room temperature in a furnace.

4. Crystallinity of LaCuOS$_{1-x}$Se$_x$ ($x=0.7$) Single-Crystal Thin Film

Figure 7:
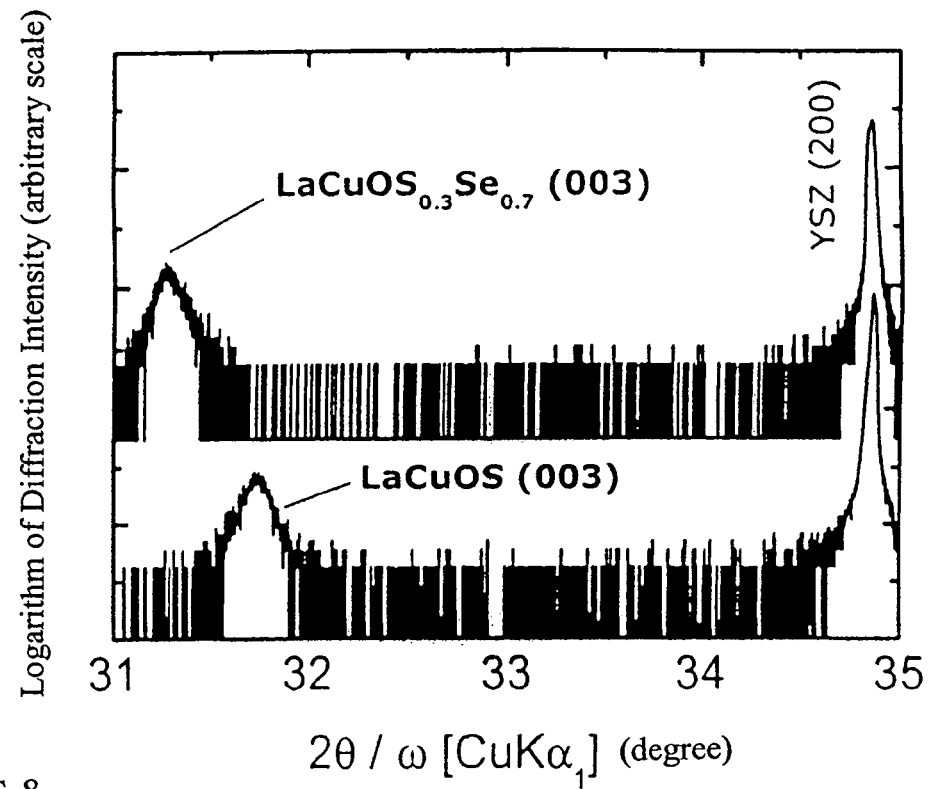
FIG. 7 is a graph showing an out-of-plane XRD pattern representing the crystallinity of a single-crystal LnCuOXX' solid-solution thin film produced in Inventive Example 4.

The crystallinity of each of the prepared single-crystal thin films was checked using a HRXRD system (ATX-G available from Rigaku; radiation source: Cu-K$\alpha_1$). An out-of-plane pattern is shown in FIG. 7. For comparison, the pattern of a LaCuOS single-crystal thin film is also shown in FIG. 7. A strong diffraction peak for the (003) plane of LaCuOS$_{1-x}$Se$_x$ ($x=0.7$) was observed together with an YSZ (200) peak. The out-of-plane pattern shows that LaCuOS$_{1-x}$Se$_x$ ($x=0.7$) is strongly oriented on YSZ (100).

Further, from the comparison with the pattern of the single-crystal LaCuOS thin film, it is proved that the length of the c-axis of the crystal is expanded (corresponding to the shift the diffraction is peaks toward a lower angle side) as the result that Se is dissolved into the S site at 70%. According to a rocking curve measurement, the tilt angle of the (003) plane of LaCuOS$_{1-x}$Se$_x$ ($x=0.7$) was 0.2-degree. Based on the in-plane measurement, it was verified that the prepared LaCuOS$_{1-x}$Se$_x$ ($x=0.7$) thin film is epitaxially grown. The epitaxial relationship is shown as follows.

LaCuOS$_{1-x}$Se$_x$ ($x=0.7$) (001)//YSZ (100)

LaCuOS$_{1-x}$Se$_x$ ($x=0.7$) (110)//YSZ (110)

In Inventive Example 4, the Continuous control of the value x or the amount of substitution in the solid solution as a final product was achieved in the range of 0 to 1.0 by changing the film thickness.

As above, even when the YSZ (100) substrate having large lattice mismatch is used, a single crystal LaCuOS$_{1-x}$Se$_x$ ($0<x<1$) could be epitaxially grown on the substrate with the X value from 0 to 1.

Comparative Example 1

Example of Using a Conventional PLD Process

A thin film was deposited on an YSZ (100) single-crystal substrate at a substrate temperature of 500 to 900° C. through a PLD process using a LaCuOS sintered body as a target under an H$_2$S atmosphere. The composition of the thin film was analyzed by an X-ray fluorescence measurement. As a result, it was proved that a La/Cu atomic ratio shows a tendency to increase as the substrate temperature is increased, and the concentration of S in the thin film shows a tendency to decrease as the substrate temperature is increased. From of these data, it may conclude that the sublimation of the components Cu and S having a high vapor pressure occurred with the increase in the substrate temperature. As a result of an XRD measurement for the deposited thin film, any pattern representing a single phase of LaCuOS was not found.

Figure 8:
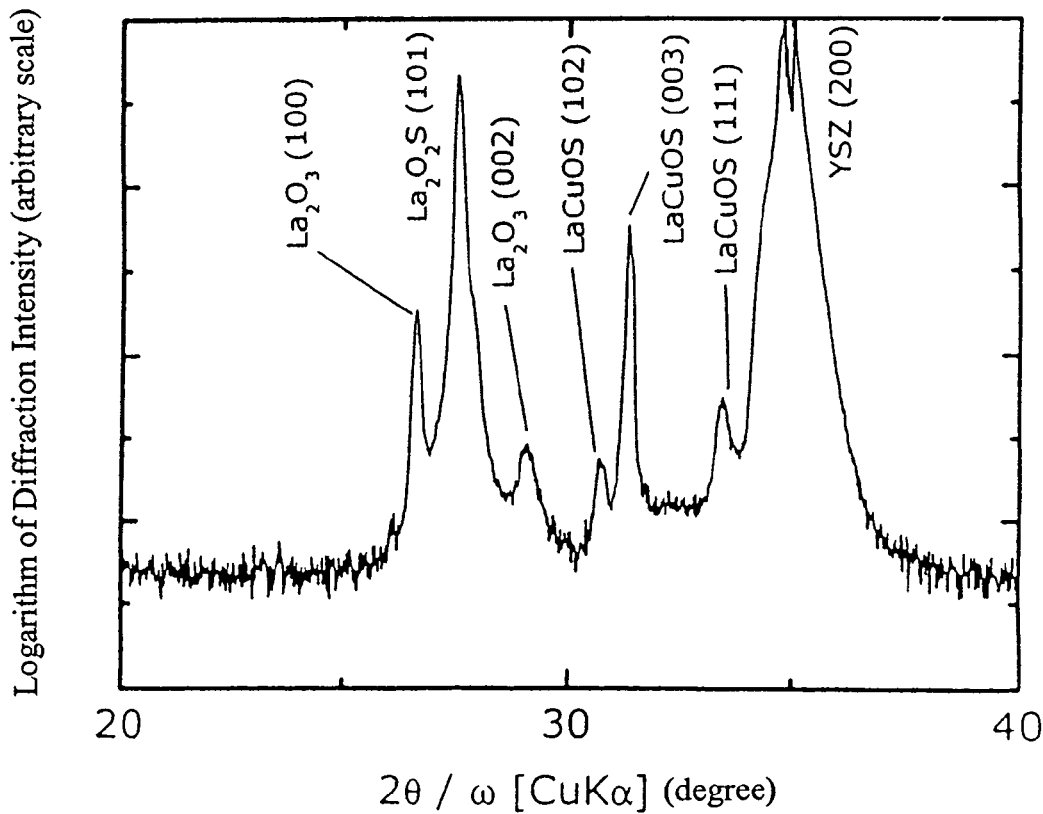
FIG. 8 is a graph showing an out-of-plane XRD pattern representing the crystallinity of an LnCuOX film produced in Comparative Example 1.

FIG. 8 shows an XRD pattern of a film deposited through a PLD process at a substrate temperature of 500° C. under an H$_2$S atmosphere as an example. In addition to the peak for LaCuOS, peaks for La$_2$O$_3$ and La$_2$O$_2$S are observed. This result is consistent with the result of the composition analysis that concentration of La in the film is higher as compared to Cu. As seen in this comparative example, it is difficult to prepare an LnCuOX thin film directly through a vapor-phase growth process including a PLD process.

Comparative Example 2

Example of the Heat Treatment Without Any Base Thin Film

Figure 9:
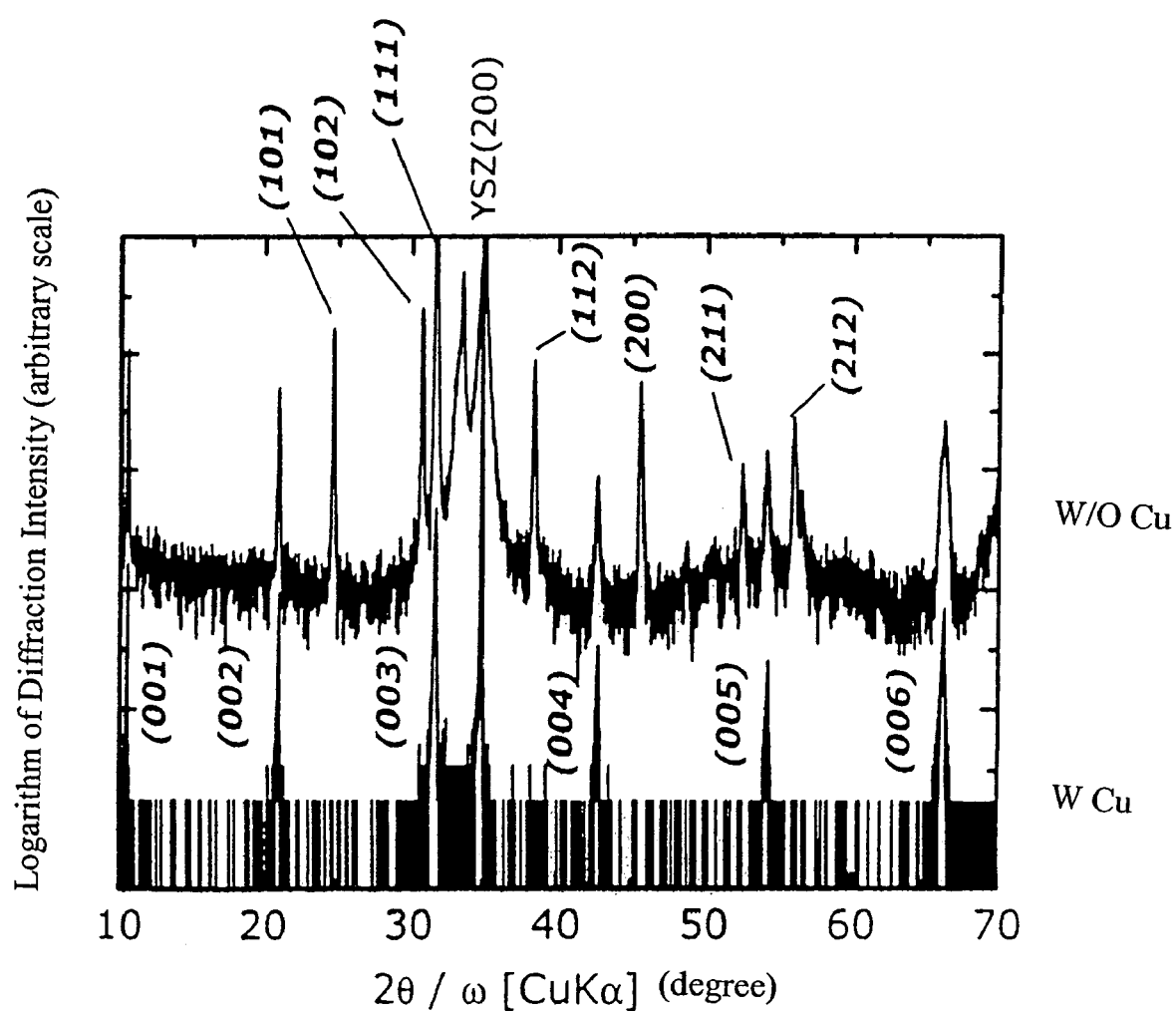
FIG. 9 is a graph showing out-of-plane XRD patterns for comparing the respective crystallinities of the LnCuOX film produced in Comparative Example 1 and an LnCuOX thin film produced using a Cu base thin film.

A thin film was deposited on an YSZ (100) single-crystal substrate at a substrate temperature of 500 to 900° C. through a PLD process using a LaCuOS sintered body as a target. In the same manner as in Inventive Example 1-3, the obtained thin film was enclosed in a vacuum capsule, and then subjected to a heat treatment at 1000° C. for 30 minutes. After the completion of the heat treatment, the thin film was cooled to room temperature in a furnace. Through a HRXRD measurement for the prepared thin film, it was verified that the obtained thin film was a single-phase polycrystalline LaCuOS. As seen in this result, a single-phase LaCuOS film can be obtained without the Cu thin film as a base layer but not a single-crystal LaCuOS, or a single-crystal LaCuOS cannot be obtained without the Cu thin film as a base layer. FIG. 9 shows respective XRD patterns with the Cu thin film and without Cu thin film.

INDUSTRIAL APPLICABILITY

The LnCuOX single-crystal thin film of the present invention is suitable to substrate black for light-emitting diodes, semiconductor lasers, field-effect transistors or hetero-bipolar transistors.

What is claimed is:

1. A method of producing an LnCuOX single-crystal thin film, wherein Ln is at least one selected from the group consisting of lanthanide elements and yttrium, and X is at least one selected from the group consisting of S, Se and Te, said method comprising the steps of:
   growing a base thin film on a single-crystal substrate;
   depositing an amorphous or polycrystalline LnCuOX thin film on said base thin film to form a laminated film;
   enclosing said laminated film in a closed vacuum environment, and
   then annealing said laminated film at a high temperature of 500° C. or more in said vacuum environment.

2. The method as defined in claim 1, wherein said base thin film is made of either one material selected from the group consisting of Cu, Cu2S, CuS, Cu2O, CuO, CuCl, CuCl2, CuI, Ag, Ag2S, Ag2O, AgO, AgCl, AgI and Au.

3. The method as defined in claim 1, wherein said single-crystal substrate is made of either one material selected from the group consisting of YSZ, Y2O3, STO, Al2O3 and MgO.

4. The method as defined in claim 1, wherein said base thin film is a Cu thin film, and said single-crystal substrate is made of either one material selected from the group consisting of YSZ, Y2O3 and MgO, wherein said Cu thin film is grown on a (100) plane of said single-crystal substrate.

5. The method as defined in claim 1, wherein said annealing step is performed in an atmosphere containing LnCuOX vapor.

6. The method as defined in claim 1, which includes the step of covering the surface of said deposited amorphous or polycrystalline LnCuOX thin film by an YSZ single-crystal plate in advance of said enclosing step.

7. The method as defined in claim 1, which includes the steps of:
   preparing an additional laminated film composed of said amorphous or polycrystalline LnCuOX thin film, said base thin film and said single-crystal substrate, or composed of said amorphous or polycrystalline LnCuOX thin film and said single-crystal substrate; and
   attaching the respective surfaces of said additional laminated film and said laminated film formed in said depositing step together in advance of said enclosing step.

8. A method of producing an $Ln_{1-y}M_yCuOX$ single-crystal thin film, wherein Ln is at least one selected from the group consisting of lanthanide elements and yttrium, $0<y<1$, and M is at least one selected from the group consisting of Mg, Ca, Sr, Ba and Zn and X is at least one selected from the group consisting of S, Se and Te, said method comprising the steps of:
   growing a base thin film on a single-crystal substrate;
   depositing an amorphous or polycrystalline $Ln_{1-y}M_yCuOX$ thin film on said base thin film to form a laminated film;
   enclosing said laminated film in a closed vacuum environment, and
   then annealing said laminated film at a high temperature of 500° C. or more in said vacuum environment.

9. A method of producing a single-crystal $LnCuOX_{1-x}X'_x$ or $Ln_{1-y}M_yCuOX_{1-x}X'_x$ solid-solution thin film, wherein $0<y<1$, $0<x<1$; Ln is at least one selected from the group consisting of lanthanide elements and yttrium; M is at least one selected from the group consisting of Mg, Ca, Sr, Ba and Zn and each of X and X' is at least one selected from the group consisting of S, Se and Te, wherein X and X' are different elements, said method comprising the steps of:
   preparing a substrate consisting of the LnCuOX single-crystal thin film or the $Ln_{1-y}M_yCuOX$ single-crystal thin film;
   depositing an $LnCuOX_{1-x}X'_x$ or $Ln_{1-y}M_yCuOX_{1-x}X'_x$ thin film on said substrate to form a laminated film;
   enclosing said laminated film in a vacuum chamber, and
   then annealing said laminated film at a high temperature of 500° C. or more in said vacuum environment.

10. A method of producing an $LnCuOX_{1-x}X'_x$ single-crystal solid solution thin film, wherein $0<x<1$, Ln is at least one selected from the group consisting of lanthanide elements and yttrium, and X and X' is at least one selected from the group consisting of S, Se and Te, wherein X and X' are different elements, said method comprising the steps of:
   growing a base thin film on a single-crystal substrate;
   depositing an amorphous or polycrystalline $LnCuOX_{1-x}X'$ solid solution thin film on said base thin film to form a laminated film;
   enclosing said laminated film in a closed vacuum environment, and
   then annealing said laminated film at a high temperature of 500° C. or more in said vacuum environment.

* * * * *